(12) United States Patent
Luu et al.

(10) Patent No.: US 8,819,507 B2
(45) Date of Patent: Aug. 26, 2014

(54) FIELD PROGRAMMABLE GATE ARRAYS WITH BUILT-IN SELF TEST MECHANISMS

(75) Inventors: Howard K. Luu, Temple City, CA (US); Jackson Y. Chia, San Gabriel, CA (US)

(73) Assignee: Raytheon Company, Waltham, MA (US)

( * ) Notice: Subject to any disclaimer, the term of this patent is extended or adjusted under 35 U.S.C. 154(b) by 297 days.

(21) Appl. No.: 12/777,228

(22) Filed: May 10, 2010

(65) Prior Publication Data
US 2011/0276850 A1    Nov. 10, 2011

(51) Int. Cl.
*G01R 31/28*     (2006.01)
*G06F 11/27*    (2006.01)
*G01R 31/3185*  (2006.01)

(52) U.S. Cl.
CPC ........ *G06F 11/27* (2013.01); *G01R 31/318533* (2013.01)
USPC .......................................... 714/726; 714/733

(58) Field of Classification Search
CPC .................. G01R 31/31853; G01R 31/318547; G01R 13/318572
USPC ................................................. 714/725–727
See application file for complete search history.

(56) References Cited

U.S. PATENT DOCUMENTS

| | | | | |
|---|---|---|---|---|
| 5,230,000 A | * | 7/1993 | Mozingo et al. | 714/732 |
| 5,450,414 A | * | 9/1995 | Lin | 714/726 |
| 5,574,733 A | * | 11/1996 | Kim | 714/728 |
| 5,596,585 A | * | 1/1997 | Njinda et al. | 714/733 |
| 5,696,771 A | * | 12/1997 | Beausang et al. | 714/726 |
| 5,748,497 A | * | 5/1998 | Scott et al. | 702/181 |
| 5,903,578 A | * | 5/1999 | De et al. | 714/726 |
| 6,003,150 A | * | 12/1999 | Stroud et al. | 714/725 |
| 6,349,398 B1 | * | 2/2002 | Resnick | 714/733 |
| 6,370,664 B1 | * | 4/2002 | Bhawmik | 714/729 |
| 6,442,721 B2 | * | 8/2002 | Whetsel | 714/726 |
| 6,861,867 B2 | * | 3/2005 | West et al. | 326/38 |

OTHER PUBLICATIONS

Pradhan, M.M.; O'Brien, E.J.; Lam, S.L.; Beausang, J.; , "Circular BIST with partial scan," Test Conference, 1988. Proceedings. New Frontiers in Testing, International , vol., No., pp. 719-729, Sep. 12-14, 1988.*

Sullivan, M.G.; Stroud, C.E.; , "Reducing the cost of circular built-in self-test by selective flip-flop replacement," Autotestcon '95. Systems Readiness: Test Technology for the 21st Century. Conference Record , vol., No., pp. 486-491, Aug. 8-10, 1995.*

(Continued)

*Primary Examiner* — Steve Nguyen
(74) *Attorney, Agent, or Firm* — Christie, Parker & Hale, LLP

(57) ABSTRACT

A system and method for designing a field programmable gate array (FPGA) with built-in test mechanism includes several enhancements to traditional circular self-test path (CSTP) BIST architecture. The FPGA BIST scheme isolates primary inputs and primary outputs to improve test coverage. Multiple signature output taps are inserted at CSTP registers throughout the test path to help improve signature aliasing probability. Enhanced CSTP register selection algorithms help prevent register adjacency problems and optimize overall resource utilization for implementation. Multiple clock domains are also handled by the FPGA BIST to allow full chip implementation of the FPGA BIST.

22 Claims, 8 Drawing Sheets

(56) References Cited

OTHER PUBLICATIONS

Corno, F.; Prinetto, P.; Sonza Reorda, M.; , "Making the circular self-test path technique effective for real circuits," Test Conference, 1994. Proceedings., International , vol., No., pp. 949-957, Oct. 2-6, 1994.*

Stroud, C.E.; Ping He; Damarla, T.R.; , "Register size vs. fault coverage in modified circular built-in self-test," Autotestcon '96, Test Technology and Commercialization. Conference Record , vol., No., pp. 23-28, Sep. 16-19, 1996.*

Carletta, Joan; Papachristou, C., "Structural constraints for circular self-test paths," VLSI Test Symposium, 1994. Proceedings., 12th IEEE , vol., No., pp. 87,92, Apr. 25-28, 1994.*

Yarandi et al., "An Optimized BIST Architecture for FPGA Look-Up Table Testing," IEEE Proceedings of the 2006 Emerging VLSI Technologies and Architecture, 2006, 2 pgs.

Hamilton et al., "Enhanced BIST-Based Diagnosis of FPGAs via Boundary Scan Access," IEEE Proceedings, VLSI Test Symposium, 1999, 6 pgs.

Wang et al., "Test and Diagnosis of Faulty Logic Blocks in FPGAs," IEEE Proceedings Computer Digital Technology vol. 146, Mar. 1999, pp. 100-106.

Alaghi et al., "An Optimum ORA BIST for Multiple Fault FPGA Look-Up Table Testing," IEEE 15th Asian Test Symposium, 2006, 6 pgs.

Huang et al., "Testing Configurable LUT-Based FPGAs," IEEE Transactions on VLSI Systems, vol. 6, No. 2, Jun. 1998, 8 pgs.

Abramovici et al., "BIST-Based Test and Diagnosis of FPGA Logic Blocks," IEEE Transactions on VLSI Systems, vol. 9, No. 1, Feb. 2001, pp. 159-171.

Sun et al., "Design and Implementation of Parity-Based BIST Scheme for FPGA Global Interconnects," IEEE Electrical and Computer Engineering Conference 2001, pp. 1251-1257.

Wang et al., "A BIST Scheme for FPGA Interconnect Delay Faults," IEEE Proceedings VLSI Test Symposium 2005, 6 pgs.

Abramovici et al., "Online BIST and BIST-based Diagnosis of FPGA Logic Blocks," IEEE Transactions on VLSI Systems, vol. 12, Dec. 2004, pp. 1284-1294.

Stroud et al., "On-Line BIST and Diagnosis of FPGA Interconnect Using Roving STARs," IEEE Transactions on VLSI Systems, pp. 27-33.

Lala, et al., "Self-Checking Logic Design for FPGA Implementation," IEEE Transactions on Instrumentation and Measurement, vol. 52, Oct. 2003, pp. 1391-1398.

Krasniewski et al., "Circular Self-Test Path: A Low-Cost BIST Technique for VLSI Circuits," IEEE Transactions on Computer Aided Design, vol. 8, No. 1, 1989, pp. 46-55.

Pilarski et al., "Estimating Testing Effectiveness of the Circular Self-Test Path Technique," IEEE Transactions on Computer-Aided Design, vol. 11, Oct. 1992, pp. 1301-1316.

* cited by examiner

FIELD PROGRAMMABLE GATE ARRAYS WITH BUILT-IN SELF TEST MECHANISMS

FIELD OF THE INVENTION

This invention relates generally to circuit design and testing, and more particularly to field programmable gate arrays (FPGAs) with built-in self-test mechanisms.

BACKGROUND OF THE INVENTION

Field programmable gate arrays (FPGAs) have evolved significantly in capacity, complexity, and speed within the last decade. Today, high-end FPGAs offer design density, speed, and IPs that can rival most high performance application-specific integrated circuit (ASIC) solutions. As a result, FPGAs have become not only a main vehicle for rapid prototyping of complex digital systems, but also have become a main component in many high-performance low-to-medium production volume systems. In the military and aerospace field in particular, there has been a steady increase of FPGA design solutions in applications that traditionally were dominated by ASICs. However, main stream FPGA designs in such mission critical systems do not implement a built-in self test (BIST) scheme that provides high fault coverage during system start-up tests. Without a high fault coverage BIST, there is a potential for system failure on the field that can result in human loss and damage to valuable resources.

Current FGPA BIST solutions exist, and they may be categorized as offline and online testing. Online testing provides the advance to testing the FPGA while it is performing system functions. Current online and offline FPGA BIST schemes generally require multiple programming files, are technology dependent, and impose an undue burden on design. For example, various offline testing schemes have been proposed to test FPGA programmable logic blocks and interconnects. A main focus of these offline schemes is to detect either faults in the configurable logic block or faults in the configurable interconnects. Generally, these schemes focus on programming part of the FPGA resources as test instrument logic—Test Pattern Generator (TPG) and Output Response Analyzer (ORA)—to test other FPGA resources. These approaches generally require multiple programming files to exhaustively test all possible faults in the FPGA logic fabrics in addition to the functional programming file. These schemes also detect faults that may not even affect the functionality of the design.

Structures using TPG and ORA are also technology dependent. Porting FPGA BIST from device families to other device families becomes a non-trivial job. Thus, although offline schemes may be well suited for FPGA device manufacture testing, they are not a good candidate for system level and field tests.

Existing online FPGA BIST schemes include concepts such as roving self-testing areas (STARs). Such online schemes generally require an intelligent controller and multiple programming files to perform dynamic partial reconfiguration of the device during normal operation. Although the STARs concept may be a good choice for fault-tolerance partial reconfiguration FPGA design, it is an overkill for FPGA start-up BIST applications.

A self-checking logic design approach for FPGA design is also known. This approach uses k-input functional cells that generate complementary outputs in fault free conditions, and a 2-rail checker cell to dynamically detect faults in the configurable logic blocks. This approach calls for a new logic synthesis algorithms specifically for this application. It also incurs up to 50% overhead which prevents it from being used as a high coverage startup BIST mechanism.

Accordingly, what is desired is the adoption of BIST in main stream FPGA design without requiring a full scan design as in ASIC BIST which is expensive for FPGA implementation. FPGA BIST should also be technology independent. In other words, FPGA BIST should be able to be mapped to different FPGA families from different vendors without changing the structure. Lastly, FPGA BIST should impose a minimum burden on the designer and at the same time provide high structural and delay fault coverage.

SUMMARY OF THE INVENTION

According to one embodiment, the present invention is directed to a method and apparatus for designing a circuit with a built-in self test mechanism. The apparatus is a computer device including a processor and a memory coupled to the processor that stores program instructions for executing by the processor. According to one embodiment, the computer device designs operation and behavior of the circuit in a non-testing mode. The computer device also identifies specific logic gates for performing the designed operation and behavior of the circuit in the non-testing mode. The computer device also designs a test path for the circuit for conducting a self-test during a testing mode. The design is configured to isolate primary inputs and outputs during the testing mode. The designing includes selecting registers of the circuit for forming the test path, identifying a plurality of the registers in the test path for outputting test response values, inserting an output tap at each of identified registers in the test path, and connecting the selected registers in a circular loop, wherein an input to a particular one of the selected registers is an output of a preceding one of the selected registers. According to one embodiment, the computer device performs logic simulation of the circuit and generates an output in response to the logic simulation.

According to one embodiment of the invention, the designing the test path further includes identifying a non-register primary output of the circuit, inserting a register into the circuit design for capturing the non-register primary output, and selecting the inserted register for being included in the test path.

According to one embodiment of the invention, the designing the test path further includes inserting a logic device for receiving a register primary input, and inserting a path from the inserted register to the logic device for selecting by the logic device a test pattern generated by the inserted register during the self-test mode.

According to one embodiment of the invention, the designing the test path further includes identifying a primary input register, and replacing the primary input register with a linear feedback shift register, wherein the linear feedback shift register generates a test pattern during the self-test mode.

According to one embodiment of the invention, the designing the test path further includes identifying an input register to an asynchronous clock domain, and replacing the input register to the asynchronous clock domain with a linear feedback shift register, wherein the linear feedback shift register generates a test pattern during the self-test mode.

According to one embodiment of the invention, the designing the test path further includes identifying an un-testable hard core of the circuit, and isolating the un-testable hard core from the test path.

According to one embodiment of the invention, the registers in the circular loop belong to more than one clock domain.

According to one embodiment of the invention, the output tap is substantially evenly spaced among the registers in the circular loop.

According to one embodiment of the invention, the registers in the test path generate test patterns during the self-test mode and provide test response values via the output taps. The test response values are compared against fault-free values. The circuit outputs an error in response to a lack of match of the test response values and the fault-free values.

According to one embodiment of the invention, the identifying the plurality of registers in the test path includes identifying registers with at least a cone-of-logic of two. In other words, there are at least 2 logic values from outputs of other flip-flops/registers contributing to the input of said register.

According to one embodiment of the invention, at least one of the plurality of registers in the test path are reordered or removed in response to the performed logic simulation.

The FPGA BIST according to one embodiment of the present invention is configured to be simple and low cost and relatively easy to be automated into the FPGA design process. It imposes minimum burden on FPGA designer and as the same time provides high structural and delay fault coverage. Having high fault coverage BIST in FPGA designs can also improve system failure diagnostics and reduce manufacturing and field test costs.

These and other features, aspects and advantages of the present invention will be more fully understood when considered with respect to the following detailed description, appended claims, and accompanying drawings. Of course, the actual scope of the invention is defined by the appended claims.

DETAILED DESCRIPTION

Embodiments of the present invention are directed to a simple, low cost, and high fault coverage logic BIST scheme for FPGA design. The FPGA BIST scheme may be used for mission critical systems in the field where a start-up test with high fault-coverage is often necessary in ensuring proper system functionality. Unlike existing FPGA BIST schemes, the FPGA BIST scheme according to embodiments of the present invention is technology independent, uses one programming file, and has minimum impact to the FPGA development process.

In general terms, the FPGA BIST scheme according to embodiments of the present invention makes use of an extension of a circular self test path (CSTP) structure disclosed in A. Krasniewksi, S. Pilarski, "Circular Self-Test Path: A Low-Cost BIST Technique," IEEE Proceedings, 24th ACM/IEEE Design Automation Conference, 1987, the content of which is incorporated herein by reference. The CSTP technique is a technique for designing self-testing integrated circuits. Synchronous sequential circuits are constructed from combinational logic blocks (CL) and edge triggered registers. The CSTP technique includes linking selected registers of the circuit into one long circular register (feedback shift register) which serves simultaneously for generating pseudo-random test patterns and test response compaction while in a self-test mode. Test response compaction generates a signature which can then be analyzed for determining if the tested circuit is faulty or fault-free.

Figure 1:
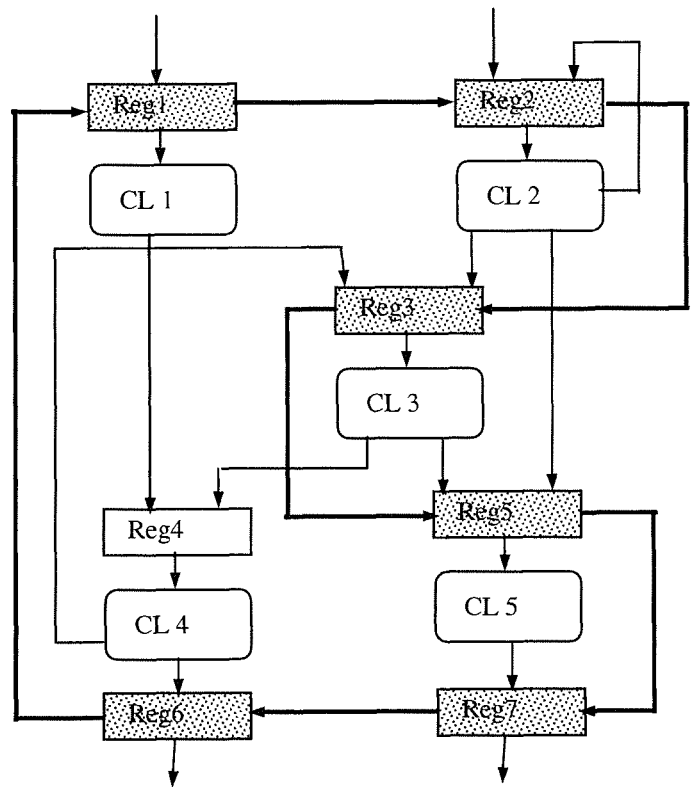
FIG. 1 is a schematic diagram of a circular test path for implementing a traditional CSTP technique.

FIG. 1 is a schematic diagram of a circular test path for implementing a traditional CSTP technique. The inclusion of a CSTP into a synchronous sequential circuit generally includes three steps. First, registers to be included in the CSTP are selected. The decision on which registers are to be included is based on test coverage requirements and hardware overhead. Second, the selected registers are replaced with CSTP registers. The registers that are not part of the CSTP operate in their normal mode. Finally, the CSTP registers are connected into a circular chain. Assuming all the registers in the synchronous sequential circuits can be preset to deterministic values, CSTP registers can act as both a test pattern generator and signature analyzer.

The traditional CSTP technique discussed in the above-referenced paper by Krasniewski does not address the problem of primary inputs and primary outputs that may corrupt system behavior during a test. Furthermore, in order to determine whether a circuit is faulty or not, a final step of response evaluation should be performed by comparing the sequence of output from selected CSTP cells that form a signature, against pre-computed fault-free values. There is no disclosure in Krasniewski on how to extract the signature using the CSTP technique without overwhelming the circuit while at the same time improving signature aliasing probability. Krasniewski also does not address register adjacency problems nor problems due to the existence of multiple clock domains and un-testable cores.

Embodiments of the present invention extend the traditional CSTP to FPGA design to provide an FPGA BIST scheme that includes several enhancements to the traditional CSTP BIST architecture. Specifically, the FPGA BIST scheme according to various embodiments of the present invention includes isolating primary inputs during a self-test to improve test coverage on the primary inputs side and to remove the dependency of system inputs. Primary outputs are also isolated and are configured to stay at default states during the entire test to ensure no undesired effects to other circuits within the system due to activities on the primary outputs. In addition, multiple signature output taps are inserted at CSTP registers throughout the test path to help improve signature aliasing probability.

Other improvements provided by the FPGA BIST is the inclusion of an algorithm for handling multiple clock domains that allow full chip implementation of the FPGA BIST. Furthermore, enhanced CSTP register selection algorithms prevent register adjacency problems and improve test hardware costs. The FPGA BIST scheme also helps to eliminate register adjacency after the CSTP registers have been inserted into the design by rearranging or removing certain CSTP registers.

Figure 2:
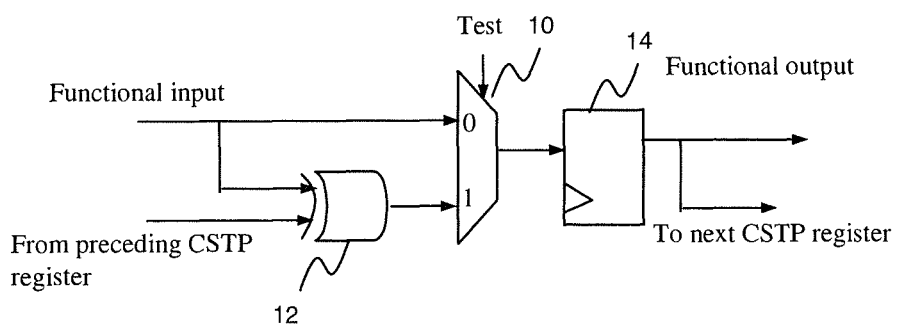
FIG. 2 is a schematic diagram of a CSTP register that may be used in various embodiments of the present invention.

FIG. 2 is a schematic diagram of a CSTP register that may be used in the various embodiments of the present invention. Each CSTP register (also referred to as a self-test register or self-test memory element) includes a logic device such as, for example, a test multiplexer 10 that selects between a self-test mode and a normal operation mode. During the self-test mode, an XOR gate 12 captures the XOR value of the functional input and the contents of a previous CSTP register thereby providing data compaction functionality. The XOR value is captured via memory element 14 (e.g. flip-flop) for feeding to a next CSTP register.

As a person of skill in the art should appreciate, the use of the CSTP BIST mechanism offers low circuit overhead and implementation cost. Given the simplicity of the self-test structure, it can be easily included in the design automation flow. For the test to be valid and deterministic, all registers have to be initialized to known values. This requirement is well suited for FPGA design because all register resources already come with this functionality. The true hardware overhead is associated with the text multiplexer 10 and XOR gate 12 for every instantiated CSTP register. The timing penalty for the functional path is limited to the extra delay introduced by the test multiplexer 10. In addition to the traditional stuck-at fault detection for both configurable logic blocks and interconnect fabrics, a CSTP technique also can detect marginal defects due to silicon fatigue over time that results in timing failure.

The quality of testing provided by a BIST implementation is generally determined by the effectiveness of random test pattern generation, the effectiveness of test response compaction, and fault coverage. The effectiveness of random pattern generation can be expressed as a fraction of all possible input patterns that are applied to the inputs of the circuit under test (CUT) during a test session. The quality of test response compaction is estimated by the probability of signature aliasing, i.e., the probability that an error response sequence produces a fault-free signature. CSTP in general does not belong to the class of maximal length LFSR (linear feedback shift registers) and is subject to an effect called limit cycling, which occurs when only a subset of all possible states is generated by the CSTP registers. However, for any CUT or any CL in FIG. 1, generally only a small number of CSTP registers contribute to testing that CUT. The effectiveness of the test pattern generation in this case should be judged by the number of different states that occur during a test session for that section of CSTP registers, not the entire state-space of CSTP registers. The effectiveness of a CSTP may be calculated via equations (1)-(3) below. It should be noted that the results of this analysis are valid if the following assumptions are true.

All primary input registers or shift registers are not included in the CSTP

There is no register adjacency in the CSTP. According to one embodiment, register adjacency means that the functional input to the CSTP register is "highly correlated" with the output of the preceding CSTP register. In the worst case, this may mean that the output of that CSTP register is always 0 or 1.

Figure 4:
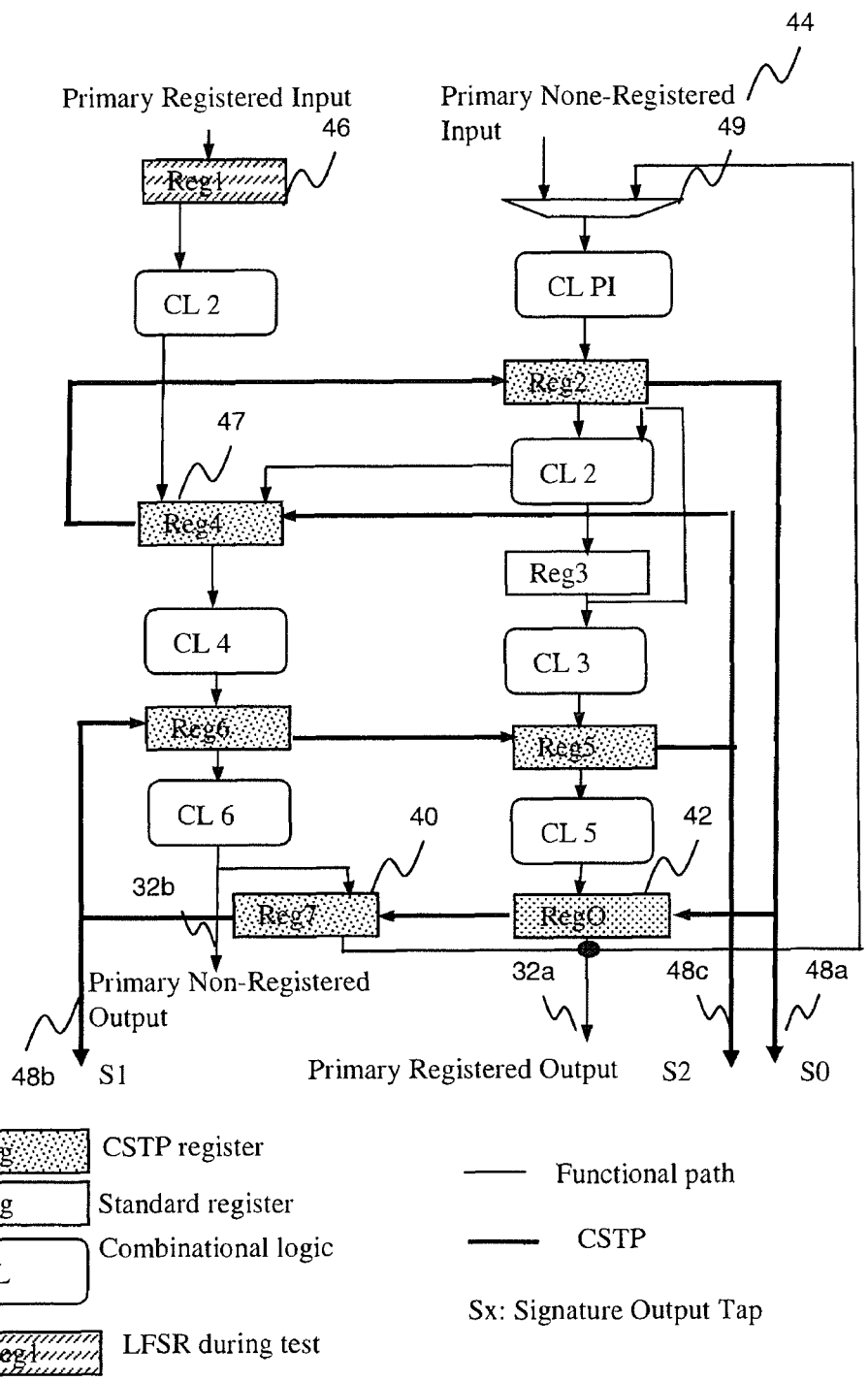
FIG. 4 is a schematic diagram of core logic of the FPGA with BIST capabilities according to one embodiment of the invention.

Given the following notations:
k: number of inputs to CUT or any CL in FIG. 4
T: number of clock cycles of a test session
ESC: expected state coverage for k-input CUT
P: total length of CSTP
S: length of the signature SAP: signature aliasing probability
EFC: expected fault coverage
Estimated performance of CSTP:

$$ESC(k, T) \geq 1 - e^{-\frac{T}{2^k}} \quad \text{Equation (1)}$$

$$SAP \approx 2^{-S} \text{ for } T \geq 8 * 2^k \quad \text{Equation (2)}$$

$$EFC \approx \left(1 - e^{-\frac{T-P}{2^k}}\right) \cdot (1 - 2^{-S}) \quad \text{Equation (3)}$$

A typical design example provides an idea of the performance numbers. Some of the high end FPGAs today have 200K flip-flops. A typical 50% utilization design will contain 100K flip-flops. More than 95% of the combinational logic has less than 24 inputs is a reasonable assumption for typical design. If we choose S to be 256, T to be $8*2^{24}$ clock cycles, and clock period of 50 MHz, the estimated performance for this CSTP self-test is:

Test run time=$8*2^{24}*20$ ns=2.68 seconds

Estimated fault coverage (EFC)=99.97%

Signature aliasing probability (SAP)=8.64E-78

Figure 3:
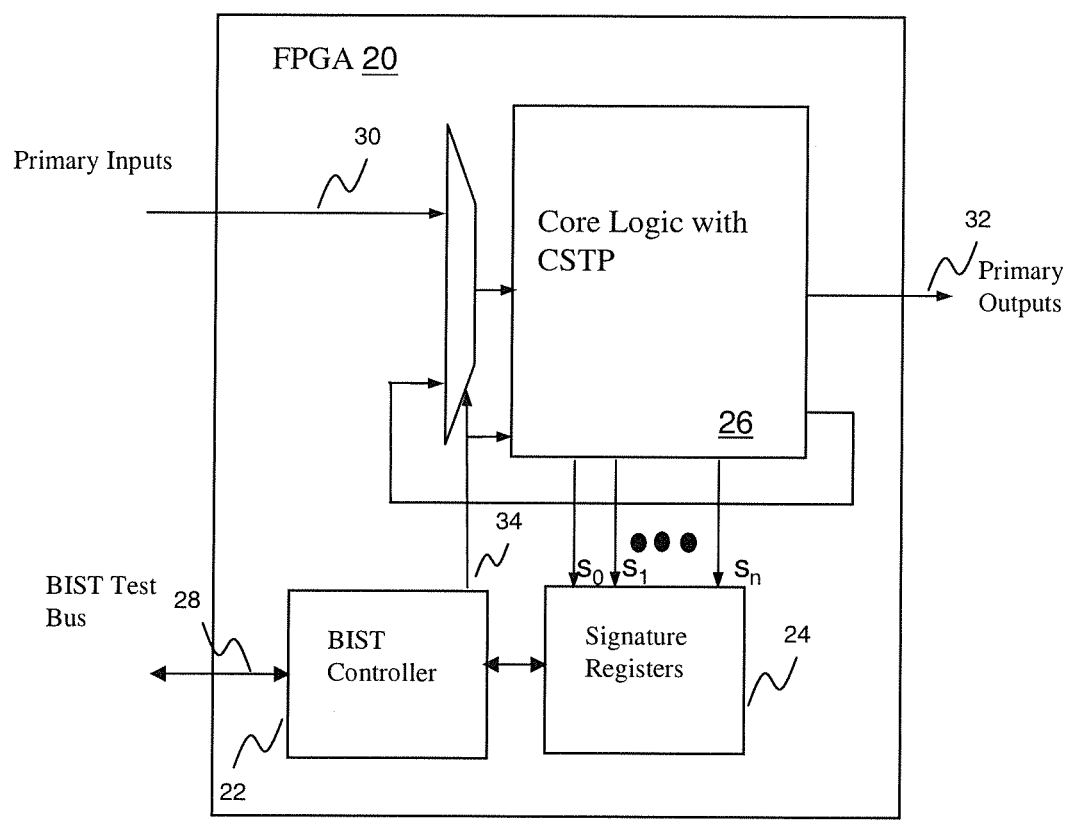
FIG. 3 is a schematic diagram of an FPGA with a BIST architecture according one embodiment of the invention.

FIG. 3 is a schematic diagram of an FPGA 20 with a BIST architecture according one embodiment of the invention. The FPGA includes a BIST controller 22 which controls the sequence of BIST pattern generation and extraction. The BIST controller 22 can be configured to automatically place the FPGA in a self-test mode by transmitting a test signal via bus 34 upon power-up of the FPGA while in use in the field. The BIST controller 22 may also perform the self-test upon a command received via a BIST test bus 28. Thus, an FPGA in use in the field may be routinely tested for detecting defects at startup or at any other selected test periods, to ensure mission critical system functionality on the field.

A core logic 26 of the FPGA is the circuit under test (CUT) and receives primary inputs 30 and generates primary outputs 32. A primary input is an external input received by the FPGA from outside the FPGA, and a primary output is an output that is transmitted outside of the FPGA. During a self-test mode, the FPGA also generates a signature S=S0, S1 . . . Sn for evaluating against fault-free values stored in signature registers 24.

FIG. 4 is a schematic diagram of the core logic 26 of the FPGA with BIST capabilities according to one embodiment of the invention. The core logic 26 includes an enhanced primary inputs/outputs structure for the CSTP. Specifically, shadow registers are added for all primary outputs that are not captured by a register (also referred to as non-registered outputs) to improve test coverage. According to one embodiment, a shadow register is a CSTP register similar to the CSTP register of FIG. 2, that is positioned to receive/capture a primary non-register output (i.e. a primary output that is not already captured by a register). In the example of FIG. 4, Register 7 is a shadow register 40 that is created for primary output 32b. The shadow registers 40 and primary output registers 42 are made part of the CSTP. The shadow register 40 together with a primary registered output 32a are used as test patterns to the primary non-registered inputs 44 during a self-test via a test multiplexer 49.

All primary outputs are logic conditioned with self-test mode to be in user selected default states to prevent outputs from corrupting system behavior. This may be done with tri-state logic and pull-up/pull-down resistors which are part of the FPGA I/O resources.

If there are more primary inputs than outputs in the FPGA, the primary input registers (i.e. registers that receive a primary input) that do not get a test pattern (also referred to as stimulus) from an output shadow register are replaced with a dual mode linear feedback shift register (LFSR) 46. According to one embodiment of the invention, the dual mode LFSR 46 serves as a regular flip-flop in a functional (non-testing) mode, and as a pseudo-random pattern generator during a self-test mode. The pattern that is generated by the dual mode LFSR 46 is provided to a CSTP register 47. In this manner the primary inputs may also be isolated from corrupting the self test signature during the self-test mode and provide good test coverage for primary inputs related logic.

Figure 5:
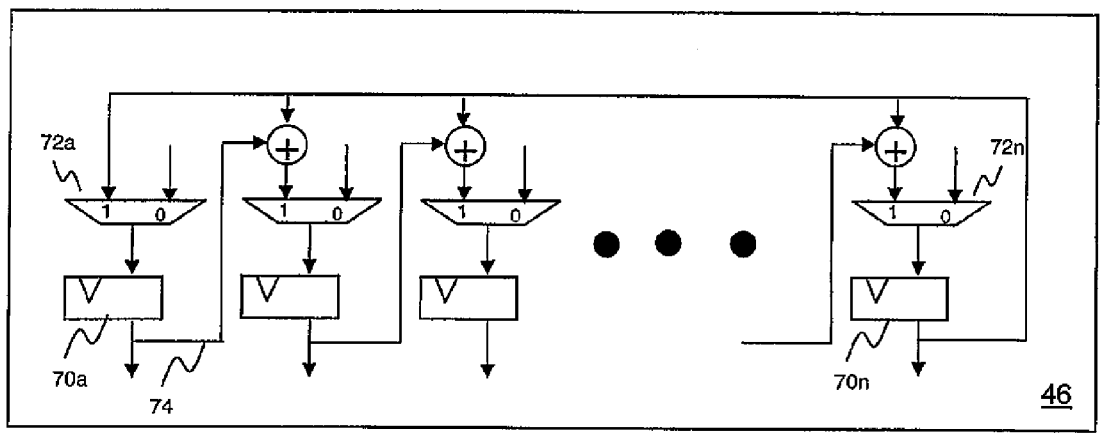
FIG. 5 is a schematic diagram of a dual mode LFSR according to one embodiment of the invention.

FIG. 5 is a schematic diagram of a dual mode LFSR 46 according to one embodiment of the invention. The LFSR 46 includes a cascade of flip flops 70a-70n which functions as regular flip-flops or pseudo-random pattern generators depending on the mode selected via multiplexers 72a-72n. The selection of a test mode allows the LFSR to generate pseudo-random test patterns for primary inputs related logic. According to one embodiment of the invention, these dual mode LFSRs are not included in the CSTP.]

According to one embodiment of the invention, the FPGA BIST mechanism also improves signature quality via multiple signature output taps 48a, 48b, 48c, and shortened path L. Path L is the number of clock cycles for an error event to affect a signature S, where S=S0, S1, ... Sn. According to one embodiment of the invention, a signature tap Sx, where x is numbered from 0 to n, is substantially evenly spaced between the CSTP registers. In this regard, the following formula may be used to select a CSTP register to which a signature tap Sx is to be inserted:

$k$=Total number of CSTP registers/number of signature taps

According to the above formula, a signature output tap is selected every kth CSTP register and used for a particular Sx. The signature is formed by taking m outputs from each tap to construct a signature of length n*m, where n is the number of signature taps at the end of a test session. For example, if the circuit in FIG. 4 has 250 CSTP registers, the spacing of selected CSTP registers corresponding to S0 and S1, and the spacing of selected CSTP registers corresponding to S1 and S2, is 83, and the spacing of selected registers corresponding to S2 and S0 is 84. Thus, the worst case L is 84 clock cycles rather than 250 clock cycles as it would be with only one signature tap. Furthermore, parameter m for each tap Sx may be a predetermined number of bits, such as, for example, 8, 16, or 32 bits. According to one embodiment of the invention, the length n of the signature and the number of bits m for each Sx tap are input by a user during design of the FPGA. The multiple output taps help improve signature aliasing (computed based on Formula 2 above), because errors that happen near the end of test session have a better chance to be observed given a shorter path L.

Figure 6:
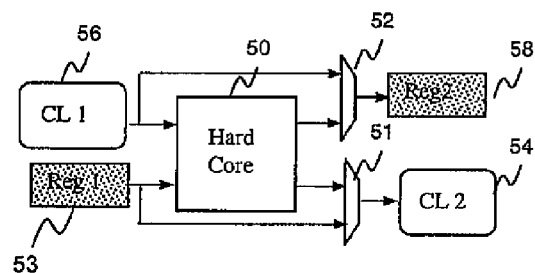
FIG. 6 is a schematic diagram of an un-testable hard core that is isolated from a CSTP test structure according to one embodiment of the invention.

One embodiment of the present invention also provides practical considerations for on-chip hard core and multiple clock domain issues. Most of today's FPGAs provide block random access memories (RAM) and digital signal processors (DSP) (e.g. Multiply-and-Accumulate). Some FPGAs such as those from Altera and Xilinx also provide processor and Ethernet cores as part of the FPGA fabric. Unlike a RAM in an ASICs, block RAMs in FPGAs can be initialized with a configuration file. These block RAMs (which appear as non-CSTP registers) and DSPs (which appear as combinational logic and non-CSTP registers), can be tested with a CSTP mechanism as well. The test coverage on block RAM and DSP will generally not be in the 90s % range due to the large state space and limited test time. Thus, according to one embodiment of the invention, inputs and outputs of the block RAM and DSP are fed through a register to improve test coverage of other logic directly connected to the RAM/DSP. Furthermore, when a design contains hard IPs with non-deterministic power up states (e.g. PowerPC cores and Ethernet MAC cores), such un-testable hard cores are isolated from the CSTP test structure as shown in FIG. 6. Specifically with reference to FIG. 6, given an un-testable hard core 50, the output of register 53 is provided to a combinatorial logic 54 via multiplexer 51, and the output of combinatorial logic 56 is fed to register 58 via multiplexer 52, during a self-test session.

In addition to the above, it is very unlikely to find an FPGA chip design that contains only one clock domain. Thus, the BIST scheme according to one embodiment of the invention handles multiple clock domains—both synchronous and asynchronous.

Figure 7:
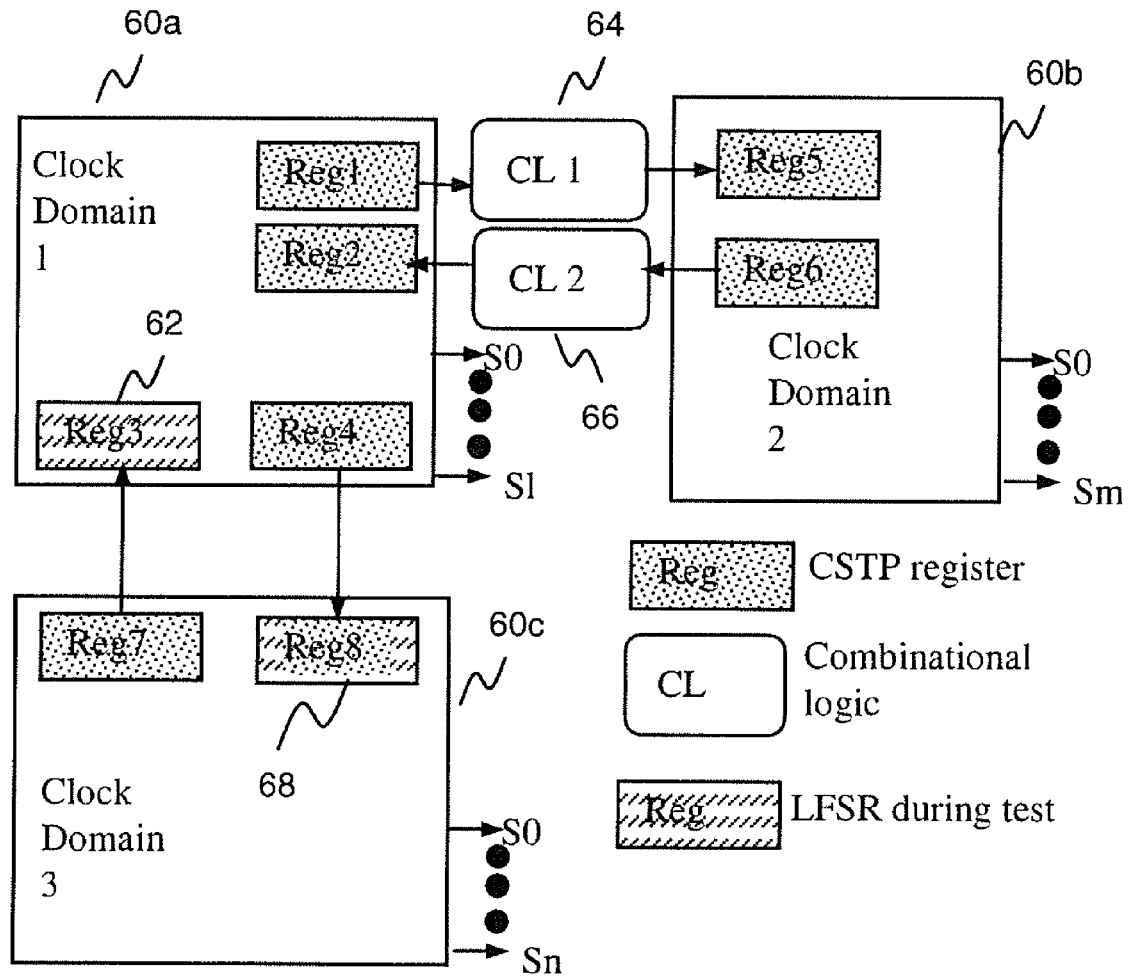
FIG. 7 is a schematic diagram of an FPGA with multiple clock domains according to one embodiment of the invention.

FIG. 7 is a schematic diagram of an FPGA with multiple clock domains 60a-60c (collectively referred to as 60). According to one embodiment of the invention, each clock domain 60 includes its own CSTP structure and one or more signature taps, similar to the one illustrated with respect to FIG. 4. Clock domain 60a includes S0 and S1 signature taps, clock domain 60b includes S0-Sm signature taps, and clock domain 60c has S0-Sn signature taps.

According to one embodiment, logic or interconnect between clock domains that are synchronous are allowed to be included in the test path. In the illustrated example of FIG. 7, clock domains 60a and 60b are synchronous. Thus, CL 64 and 66 are allowed to be included in the CSTP and hence, may be tested.

According to one embodiment, logic or interconnect between clock domains that are asynchronous are not tested. In the illustrated example of FIG. 7, clock domains 60a and 60c are asynchronous. The input registers 62, 68 in respectively clock domain 60a and clock domain 60c which are used to synchronize the input from respectively clock domain 60c and clock domain 60a, are each replaced with a dual mode LFSR which is similar to the LFSR of FIG. 5. The LFSR generates pseudo-random test patterns during the self test mode and thus, help isolate the inputs to the clock domains 60a and 60c from corrupting test signature during the self test.

Figure 8:
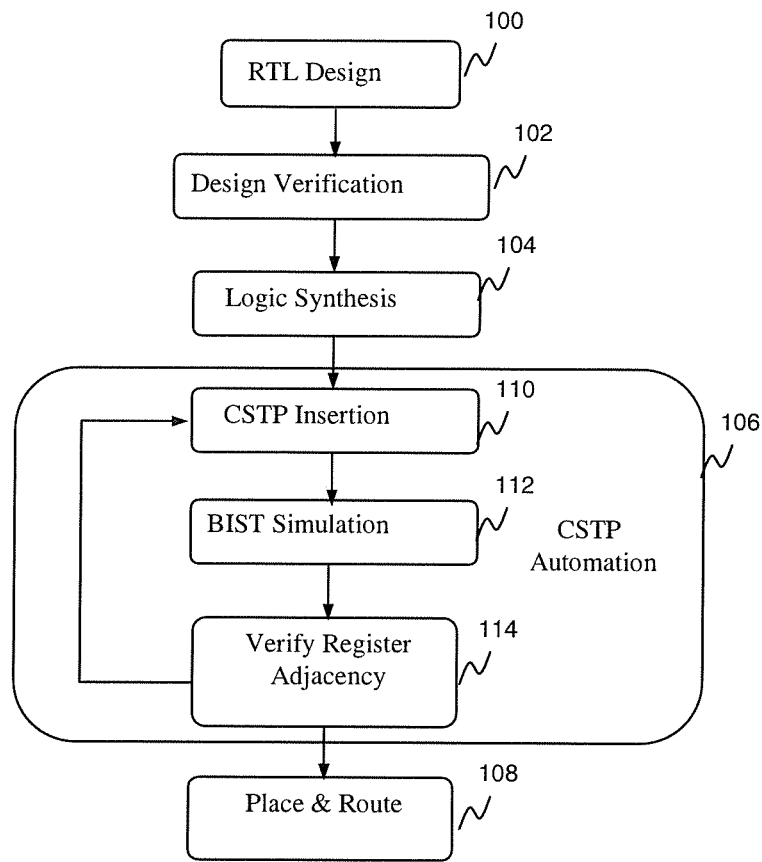
FIG. 8 illustrates an FPGA design flow according to one embodiment of the invention.

FIG. 8 illustrates an FPGA design flow according to one embodiment of the invention. The design may be implemented by an electronic design automation tool which is executed by a processor in a computer device, based on computer program instructions stored in the computer's memory.

In step 100, the processor invokes the design tool to execute a register transfer level (RTL) design 100 where the circuit's behavior and operation in a functional, non-testing mode, are defined in terms of the flow of signals between hardware registers and logical operations performed on those signals.

In step 102, the processor invokes the design tool to verify that the logic design conforms to a given specification.

In step 104, the processor invokes the design tool for logic synthesis where an abstract form of desired circuit behavior in the functional, non-testing mode is turned into a design implementation in terms of logic gates.

A person of skill in the art will understand that steps 100-104 very much follow steps in a conventional design flow. Unique for BIST design flow is in step 106 where the processor invokes the design tool for designing an improved CSTP BIST mechanism. According to one embodiment of the invention, the design of the improved CSTP BIST mechanism occurs after the design of the operation and behavior of the circuit in the functional, non-testing mode, and after the specific logic gates for performing the designed operation and behavior have been concluded, such as, for example, after logic synthesis step 104. However, a person of skill in the art should recognize that the design of the improved CSTP BIST mechanism may occur at other steps of the overall design of the FPGA as will be appreciated by a person of skill in the art.

In step 108, the processor invokes the design tool for placement and routing to assign exact locations for various circuit components within the chip's core area. An FPGA may then be manufactured based on the generated design.

Referring again to step 106 for the design flow process, the step of designing an improved CSTP BIST mechanism includes invoking the design tool for executing a CSTP insertion algorithm in step 110. After the CSTP has been inserted into the design, the processor invokes the design tool in step 112 for conducting BIST simulation. During BIST simulation, the design tool performs logic simulation in both a functional mode and a BIST mode to verify that the insertion of the CSTP was done correctly. Results of the simulation are output to a user of the tool via a display screen or other output devices coupled to the computer device.

According to one embodiment of the invention, BIST simulation generates a report that identifies the CSTP registers that have been toggled for inclusion in the test path. Toggle reports may be generated from logic simulation tools such as those from Mentor Graphics' ModelSim, Cadence Incisive, and Synopsys' VCS. The processor further generates toggle statistics and compares the toggle statistics to the input threshold by the user. If the toggle statistics are below the input threshold, the CSTP registers are reordered and another report is run. According to one embodiment, this is handled the same way as in step 114 described below. Register adjacency in step 114 is the special case when toggle rate is 0. This procedure continues until a desired toggle ratio as identified by the input threshold is achieved. According to one embodiment, a 15% toggle ratio may be entered, and indicates toggling of every other register in the FPGA. However, a 20%-25% toggle ratio may also be entered by the user.

In step 114, the processor further evaluates the toggle report to verify that no register adjacency problems exist. If adjacent registers have been identified, the processor executes a register adjacency removal algorithm. This step helps maximize the effectiveness of pattern generation and result in higher fault coverage. In this regard, the adjacency removal algorithm solves the adjacency problem by either removing the identified CSTP register in the circular test path, or by reordering the identified CSTP registers so that no two CSTP registers are adjacent to one another in the test path. Below is a pseudocode of an adjacency removal algorithm according to one embodiment of the invention.

Denote:
    $R_i$, CSTP register i and $R_{i-1}$ is the preceding CSTP register
    $Q_i$, output of CSTP register i
    $D_i$, functional input to CSTP register i
    Cone_of_logic ( $D_i$ ) is a function to find group of register output that contribute to logic value of $D_i$. This function returns a pointer to a data structure $C_i$ that have number of nodes (register output), and an array of node identifiers
    Diff_of_cone ($C_i$, $C_j$) is a function to compare two cone of logic data structure and returns the number of nodes that are not common between $C_i$ and $C_j$
    Swap ($R_i$, $R_j$) is a function to swap two CSTP register $R_i$ and $R_j$
    Remove ( $R_i$ ) is a function to remove $R_i$ from CSTP registers
For each $R_i$ with $Q_i$ toggle rate < threshold
    $C_i$ = Cone_of_logic ($D_i$)
    $C_{i-1}$ = Cone_of_logic ($D_{i-1}$)

Figure 9:
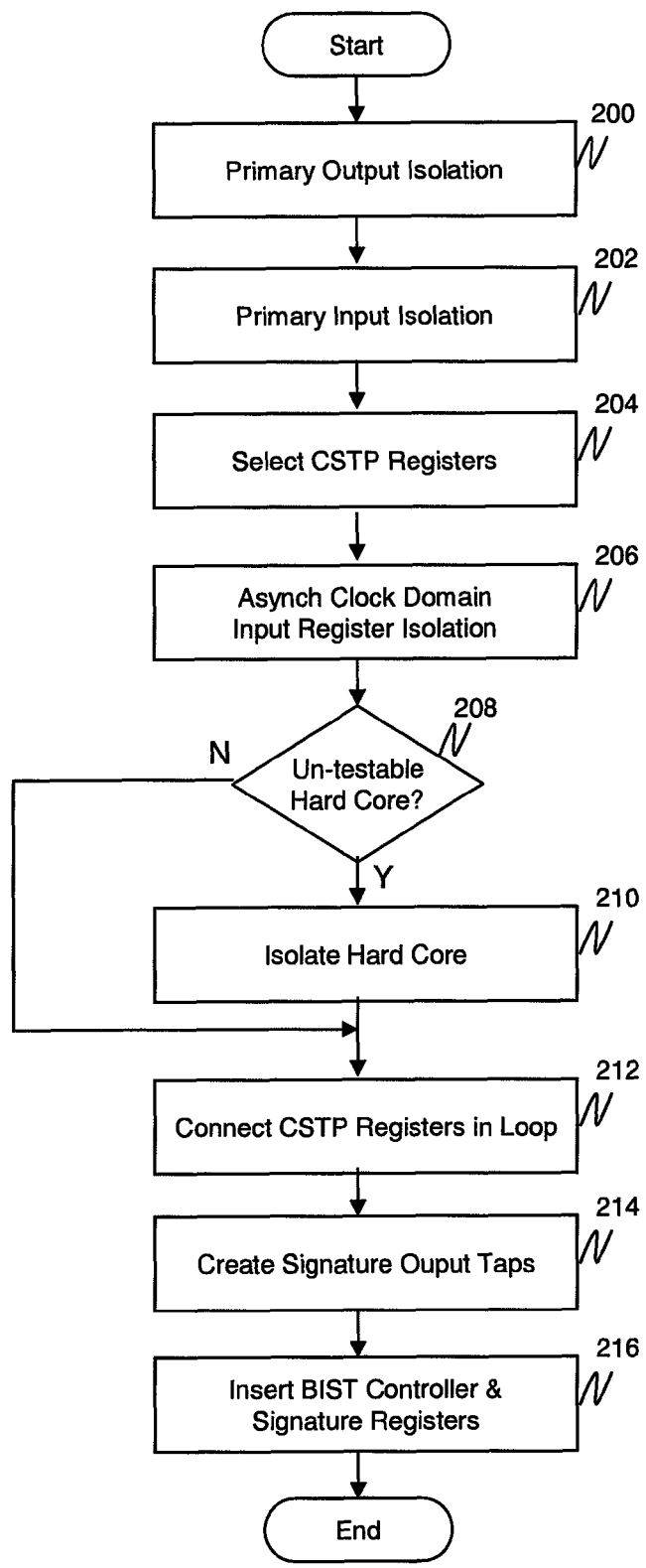
FIG. 9 is a more detailed flow diagram of a CSTP insertion algorithm according to one embodiment of the invention.

-continued $N_i$ = Diff_of_cone ($C_i$, $C_{i-1}$)
    For (j = i–2; j>0; j— )  //loop thru all the preceding R until reaching itself
        $C_j$ = Cone_of_logic ($D_j$)
        $N_j$ = Diff_of_cone ($C_i$, $C_j$)
        $C_{j-1}$ = Cone_of_logic ($D_{j-1}$)
        $N_{j-1}$ = Diff_of_cone ($C_i$, $C_{j-1}$)
        If ($N_j$ > $N_i$ && $N_{j-1}$ > $N_i$)
            Swap ($R_i$, $R_j$)
            break
    If (j == 0) Remove ( $R_i$)  //reaching itself and could not find optimum place FIG. 9 is a more detailed flow diagram of the CSTP insertion algorithm executed by the processor in step 110, according to one embodiment of the invention. In step 200, the processor designs the test path so that primary outputs are isolated during a self-test to prevent such outputs from corrupting system behavior during the test, and to serve as stimulus to the primary inputs during the test. In this regard, the processor identifies all non-register primary outputs (i.e., outputs that are not captured by a register), and inserts into the FPGA design a shadow register, such as, for example, shadow register 40 of FIG. 4, for each identified non-register primary output. The non-register outputs are then captured by the inserted shadow registers which generate pseudo-random test patterns during a test mode. The processor further configures all primary outputs (registered or non-registered) in the design to transition to high impedance states with proper pull-up/pull-down resistors during a self-test mode as will be understood by a person of skill in the art.

In step 202, the processor designs the test path so that primary inputs are also isolated during the self-test to improve test coverage on the primary inputs side and to remove the dependency of system inputs. In this regard, the processor inserts an isolation logic device into the FPGA design, such as for example, multiplexer 49, and inserts a feedback path from the shadow registers and primary output registers to the multiplexer. If the processor detects that there are more inputs than outputs, the extra input registers in the FPGA design that are not triggered by a shadow register are each replaced with a dual mode LFSR such as, for example, LFSR 46 of FIG. 5.

In step 204, the processor executes a CSTP register selection algorithm for selecting the registers to be included in the test path. According to one embodiment, all primary output registers, such as, for example, primary output register 42, are selected for including in the test path. The processor further receives a number of inputs to logic cones above which the processor will replace a normal register in the design with a CSTP register. This allows trade-off between test coverage and design overhead. According to one embodiment of the invention, the input number is restricted to be at least 2 to help remove the register adjacency problem that may be introduced by flip flops that may be arranged in series, such as, for example, in shift registers. By restricting the input to at least two, the probability of two highly correlated CSTP registers back to back is dramatically reduced.

In step 206, the processor identifies and isolates the input registers of an asynchronous clock domain, such as, for example, registers 62 and 68 of FIG. 7. According to one embodiment of the invention, the clock domain information is provided by a user of the design tool as an input parameter. According to one embodiment, the isolating of an asynchronous clock domain includes replacing the input registers of the asynchronous clock domain with a dual mode LFSR, such as, for example, the LFSR of FIG. 5.

In step 208, a determination is made as to whether there are any un-testable hard cores in the design that need to be isolated from the test path. If the answer is YES, such hard cores, such as, for example, hard core 50 of FIG. 6, are isolated from the test path in step 210. In this regard, the processor adds to the FPGA design, multiplexers 51, 52 which feed the output of registers or combinatorial logic which would be fed to the hard core during a functional mode, to combinatorial logic and registers outside of the hard core during the test mode.

In step 212, the CSTP is connected in a loop by inserting paths between the CSTP registers so that the output of a particular CSTP register is an input of a next CSTP register on the circular path. In generating the loop, the processor considers the clock domain information provided by the user of the tool. According to one embodiment, each clock domain forms a separate loop and hence, a separate test path.

In step 214, the processor identifies multiple signature output taps to improve signature aliasing probability. According to one embodiment, the user of the design tool provides the number of signature output taps to be created. The signature output taps are then evenly distributed amongst the various clock domains in proportion to the number of toggled CSTP registers in each clock domain. For example, if the number of signature output taps is four, and the FPGA has two clock domains, with one clock domain having 15 CSTP registers and the other clock domain having five CSTP registers, the processor inserts three of the four output taps in the first clock domain, and one output tap in the second clock domain. Furthermore, the spacing of the output taps are selected to be evenly spaced. For example, every fifth CSTP register in the first clock domain is selected for inserting a signature output tap. Thus, the number of clock cycles between S0 and S1, between S1 and S2, and between S2 and S0, in the first clock domain, is five. The inserting of a signature output tap includes inserting an output path from the selected CSTP register into the signature registers 24 for comparison.

In step 216, the processor inserts into the FPGA design a BIST controller for controlling a self-test mode and signature registers for receiving parallel test response values from the signature output taps and comparing those response values to fault-free values in the signature registers.

Figure 10:
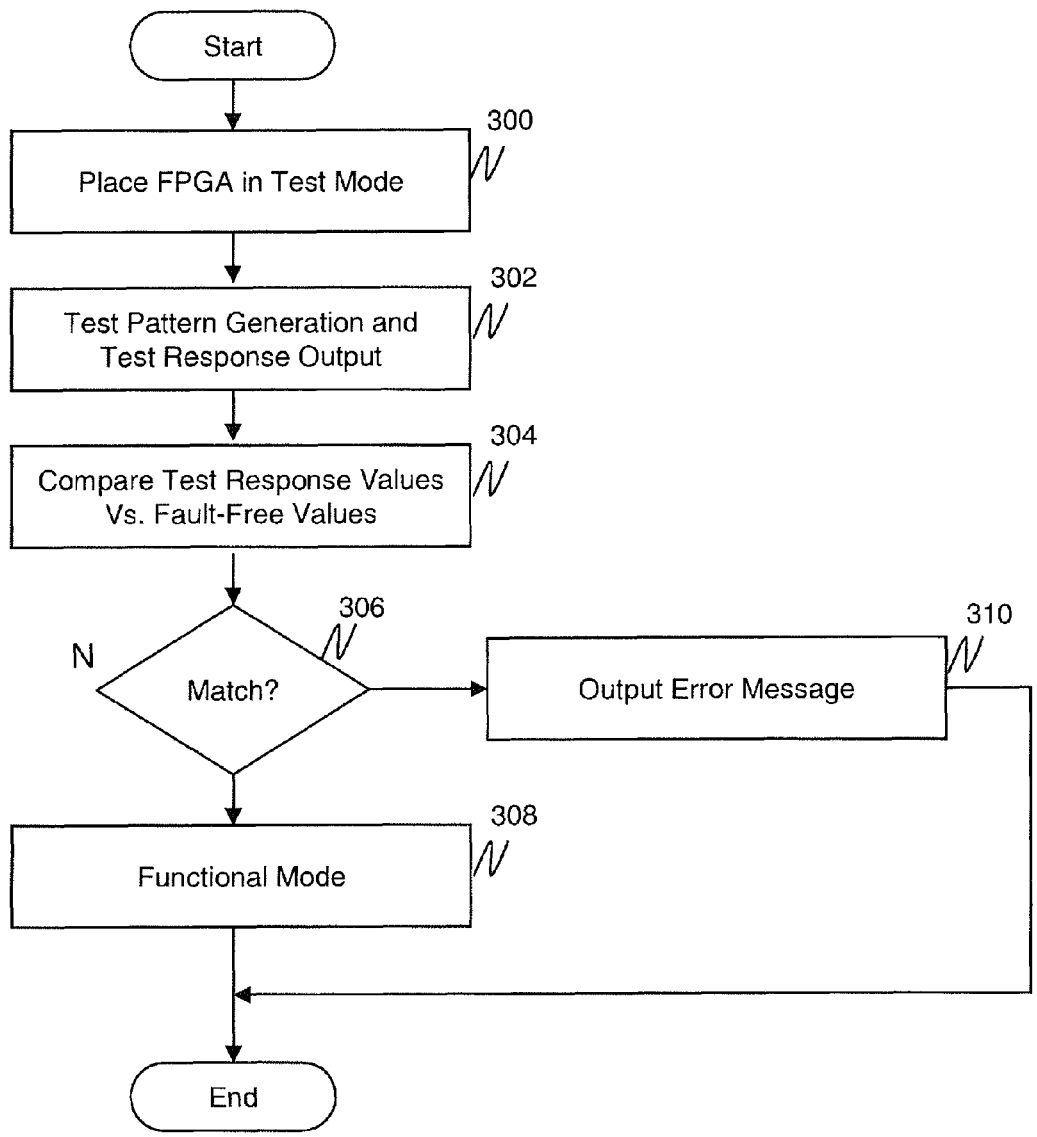
FIG. 10 is a flow diagram of a BIST process executed by an FPGA according to one embodiment of the invention.

FIG. 10 is a flow diagram of a BIST process executed by an FPGA according to one embodiment of the invention. In step 300, the BIST controller 22 places the FPGA in test mode by transmitting a test signal over bus 34.

In step 302, the core logic 26 with the CSTP generates a test pattern at each clock cycle while simultaneously performing test response compaction. In this regard, the CSTP is initialized by placing all registers into a known state. Each CSTP register generates a test pattern during each clock cycle while at the same time outputting a compressed test response that is used as input to a next CSTP register in the path. Test pattern and response compaction proceeds for a total number of predetermined clock cycles.

At the end of the test clock cycle, the core logic 26 outputs a compacted test response from each of the multiple signature output taps, in parallel, as test values that together form a signature, and which are compared against stored fault-free values in the signature registers 24 in step 304.

In step 306, a determination is made as to whether the output test values match the pre-computed fault-free values. If the answer is YES, the FPGA transitions to a functional mode in step 308 where the intended functions of the FPGA are executed.

If, however, the values do not match, it is presumed that there is an error in the FPGA. The BIST controller thus outputs an error signal in step 310 which may be displayed as an error message on an output device. The faulty FPGA may be repaired or replaced in response to the error message.

A person of skill in the art should recognize that the above-described BIST methodology provides a start up self test capability that can help guarantee mission critical system functionality on the field.

Although embodiments of the present invention are described with respect to FPGA BIST, a person of skill in the art would understand that the embodiments of the present invention are applicable to any combinatorial circuit design, and in fact, may be used as an alternative to traditional BIST mechanisms for ASIC chips.

It is the applicants intention to cover by claims all such uses of the invention and those changes and modifications which could be made to the embodiments of the invention herein chosen for the purpose of disclosure without departing from the spirit and scope of the invention. Thus, the present embodiments of the invention should be considered in all respects as illustrative and not restrictive, the scope of the invention to be indicated by the appended claims and their equivalents rather than the foregoing description.

What is claimed is:

1. A method for chip circuit design with a built-in self test mechanism comprising:
   isolating primary outputs via a shadow register configured to capture a non-register primary output, wherein the non-register primary output is one of the primary outputs not resulting from a register;
   isolating primary inputs via an isolation logic device configured to capture a primary input, wherein the shadow register is configured to provide stimulus to the isolation logic device;
   selecting registers of the circuit for forming a test path, the selected registers including the shadow register and primary output registers;
   identifying n of the registers in the test path for outputting test response values, wherein n is an integer greater than 1;
   inserting an output tap from each one of the n identified registers in the test path into a signature register for forming n signature inputs from n output taps, wherein the n signature inputs together form a signature for comparing against one or more stored values in the signature register, wherein the output taps are substantially evenly spaced among the selected registers in the test path; and
   connecting the selected registers in a circular loop, wherein an input to a particular one of the selected registers is an output of a preceding one of the selected registers.

2. The method of claim 1, wherein the isolating the primary outputs includes:
   identifying the non-register primary output of the circuit; and
   inserting the shadow register into the circuit design for capturing the non-register primary output.

3. The method of claim 2, wherein the isolating the primary inputs includes:
   inserting the isolation logic device for receiving the primary input;
   inserting a feedback path from the shadow register and the primary output register to the isolation logic device for selecting by the isolation logic device a test pattern generated by the shadow register and the primary output register during the self-test mode.

4. The method of claim 3, wherein the isolating the primary inputs further includes:

identifying a primary input register not receiving the test pattern generated by the shadow register and the primary output register during the testing mode;
replacing the primary input register with a linear feedback shift register, wherein the linear feedback shift register generates a test pattern during the self-test mode.

5. The method of claim 1, wherein the method for chip circuit testing further includes:
identifying an input register to an asynchronous clock domain;
replacing the input register to the asynchronous clock domain with a linear feedback shift register, wherein the linear feedback shift register generates a test pattern during the self-test mode.

6. The method of claim 1, wherein the method for chip circuit testing further includes:
identifying an un-testable hard core of the circuit; and
isolating the un-testable hard core from the test path.

7. The method of claim 1, wherein the registers in the circular loop belong to more than one clock domain.

8. The method of claim 1, wherein, the registers in the test path generate test patterns during the testing mode and provide test response values via the output taps, the test response values being compared against the one or more stored values, wherein the circuit is configured to output an error in response to a lack of match of the test response values and the one or more stored values.

9. The method of claim 1, wherein the identifying the plurality of registers in the test path includes identifying registers with at least a cone-of-logic of two.

10. The method of claim 1 further comprising:
removing at least one of the plurality of registers in the test path in response to the performed logic simulation.

11. The method of claim 1, wherein the signature is of size n×m, wherein in is an integer greater than 0 and the signature is configured to be formed by taking m bits from each of the n output taps.

12. The method of claim 1, wherein the circuit is a field-programmable gate array, and the test path is a circular self-test path wherein each of the registers have logic for compaction of the test response values.

13. The method of claim 1, wherein the inserting the output tap includes inserting an output tap every kth register until the n output taps have been inserted, wherein k is an integer identified based on dividing the selected registers by n.

14. The method of claim 1 further comprising:
identifying a first one of the selected registers as being adjacent to a second one of the selected registers; and
in response to the identifying, removing the first or the second one of the selected registers from the test path.

15. A computer device for designing a circuit with a built-in self test mechanism comprising:
a processor; and
a memory coupled to the processor and storing program instructions therein, the program instructions including:
isolating primary outputs via a shadow register configured to capture a non-register primary output, wherein the non-register primary output is one of the primary outputs not resulting from a register;
isolating primary inputs via an isolation logic device configured to capture a primary input, wherein the shadow register is configured to provide stimulus to the isolation logic device;
selecting registers of the circuit for forming a test path, the selected registers including the shadow registers and primary output registers;
identifying n of the registers in the test path for outputting test response values, wherein n is an integer greater than 1;
inserting an output tap from each one of the n identified registers in the test path into a signature register for forming n signature inputs from n output taps, wherein the n signature inputs together form a signature for comparing against one or more stored values in the signature register, wherein the output taps are substantially evenly spaced among the selected registers in the test path; and
connecting the selected registers in a circular loop, wherein an input to a particular one of the selected registers is an output of a preceding one of the selected register.

16. The computer device of claim 15, wherein the isolating the primary outputs further include computer instructions for:
identifying the non-register primary output of the circuit; and
inserting the shadow register into the circuit design for capturing the non-register primary output.

17. The computer device of claim 16, wherein the isolating the primary inputs further includes computer instructions for:
inserting the isolation logic device for receiving the primary input;
inserting a feedback path from the shadow register and the primary output register to the isolation logic device for selecting by the isolation logic device a test pattern generated by the shadow register and the primary output register during the self-test mode.

18. The computer device of claim 17, wherein the isolating the primary inputs further includes:
identifying a primary input register not receiving the test pattern generated by the shadow register and the primary output register during the testing mode;
replacing the primary input register with a linear feedback shift register, wherein the linear feedback shift register generates a test pattern during the self-test mode.

19. The computer device of claim 15, wherein the computer device further includes computer instructions for:
identifying an input register to an asynchronous clock domain;
replacing the input register to the asynchronous clock domain with a linear feedback shift register, wherein the linear feedback shift register generates a test pattern during the self-test mode.

20. The computer device of claim 15, wherein the computer device further includes computer instructions for:
identifying an un-testable hard core of the circuit; and
isolating the un-testable hard core from the test path.

21. The computer device of claim 15, wherein the registers in the circular loop belong to more than one clock domain.

22. The computer device of claim 15, wherein, the registers in the test path generate test patterns during the testing mode and provide test response values via the output taps, the test response values being compared against the one or more stored values, wherein the circuit is configured to output an error in response to a lack of match of the test response values and the one or more stored values.

* * * * *